(12) United States Patent
Yoshida

(10) Patent No.: US 8,697,547 B2
(45) Date of Patent: Apr. 15, 2014

(54) METHOD FOR MANUFACTURING SILICON EPITAXIAL WAFER

(75) Inventor: Tomosuke Yoshida, Annaka (JP)

(73) Assignee: Shin-Etsu Handotai Co., Ltd., Tokyo (JP)

( * ) Notice: Subject to any disclaimer, the term of this patent is extended or adjusted under 35 U.S.C. 154(b) by 0 days.

(21) Appl. No.: 13/510,336

(22) PCT Filed: Nov. 11, 2010

(86) PCT No.: PCT/JP2010/006616
§ 371 (c)(1),
(2), (4) Date: May 17, 2012

(87) PCT Pub. No.: WO2011/074176
PCT Pub. Date: Jun. 23, 2011

(65) Prior Publication Data
US 2012/0231612 A1    Sep. 13, 2012

(30) Foreign Application Priority Data

Dec. 15, 2009 (JP) ................................. 2009-284029

(51) Int. Cl.
*H01L 21/322* (2006.01)
*H01L 21/36* (2006.01)
*H01L 21/20* (2006.01)

(52) U.S. Cl.
USPC ...................... 438/477; 438/481; 257/E21.09

(58) Field of Classification Search
USPC .............................. 438/477, 481; 257/E21.09
See application file for complete search history.

(56) References Cited

U.S. PATENT DOCUMENTS

| 6,596,095 | B2 * | 7/2003 | Ries et al. ..................... 148/33.1 |
| 2005/0208674 | A1 | 9/2005 | Tokushima et al. |
| 2005/0250349 | A1 * | 11/2005 | Sadamitsu et al. ............ 438/800 |
| 2006/0075960 | A1 | 4/2006 | Borgini et al. |
| 2006/0289091 | A1 | 12/2006 | Buonassisi et al. |
| 2007/0178668 | A1 * | 8/2007 | Nakai et al. ................... 438/471 |

(Continued)

FOREIGN PATENT DOCUMENTS

| JP | A-11-283987 | 10/1999 |
| JP | A-2002-176058 | 6/2002 |

(Continued)

OTHER PUBLICATIONS

English-translation of International Preliminary Report on Patentability issued in International Application No. PCT/JP2010/006616 dated Jul. 19, 2012.

(Continued)

*Primary Examiner* — Luan C Thai
(74) *Attorney, Agent, or Firm* — Oliff PLC

(57) ABSTRACT

A method for manufacturing a silicon epitaxial wafer, including vapor-phase growing a silicon single crystal thin film on a silicon single crystal substrate in a hydrogen atmosphere while supplying a source gas; and cooling a silicon epitaxial wafer having the formed silicon single crystal thin film by calculating a temperature at which a standard value or a process average value of concentration of an evaluation target impurity present in the silicon single crystal thin film coincides with solubility limit concentration of the evaluation target impurity and setting a cooling rate of the silicon epitaxial wafer after the film formation to be less than 20° C./sec in a temperature range of at least plus or minus 50° C. from the calculated temperature.

4 Claims, 3 Drawing Sheets

(56) References Cited

U.S. PATENT DOCUMENTS

| | | |
|---|---|---|
| 2009/0017291 A1 | 1/2009 | Sadamitsu et al. |
| 2009/0277376 A1 | 11/2009 | Schauer et al. |
| 2010/0213406 A1 | 8/2010 | Buonassisi et al. |

FOREIGN PATENT DOCUMENTS

| | | |
|---|---|---|
| JP | B2-3664101 | 6/2005 |
| JP | A-2005-265718 | 9/2005 |
| JP | B2-3755586 | 3/2006 |
| JP | A-2008-546212 | 12/2008 |
| TW | 541581 | 7/2003 |
| TW | 200946723 A1 | 11/2009 |

OTHER PUBLICATIONS

Feb. 1, 2011 International Search Report issued in International Patent Application No. PCT/JP2010/006616.

Japanese Patent Office, Notification of Reasons for Refusal issued Oct. 15, 2013 in Japanese Patent Application No. 2009-284029 w/Partial English-language Translation.

Taiwanese Office Action issued in Taiwanese Patent Application No. 99139389 dated Nov. 5, 2013 (w/ partial translation).

* cited by examiner

METHOD FOR MANUFACTURING SILICON EPITAXIAL WAFER

TECHNICAL FIELD

The present invention relates to a method for manufacturing a silicon epitaxial wafer, and more particularly to a method for manufacturing a silicon epitaxial wafer having lower impurity concentration in a surface layer portion of a silicon single crystal thin film than those in conventional examples.

BACKGROUND ART

A silicon epitaxial wafer is manufactured as follows, for example.

That is, in a state that a silicon single crystal substrate is placed in a reaction vessel of a vapor-phase growth apparatus and a hydrogen gas is flowed, a temperature in the reaction vessel is increased to 1100° C. to 1200° C. (a temperature increasing step).

Further, when the temperature in the reaction vessel reaches 1100° C. or above, a natural oxide film ($SiO_2$: Silicon Dioxide) formed on a substrate surface is removed.

In this state, a silicon source gas such as trichlorosilane ($SiHCl_3$) and a dopant gas such as diborane ($B_2H_6$) or phosphine ($PH_3$) are supplied into the reaction vessel together with the hydrogen gas. In this manner, a silicon single crystal thin film is vapor-phase grown on a main surface of the substrate (a film forming step).

After vapor-phase growing the thin film in this manner, the supply of the source gas and the dopant gas is stopped, and the temperature in the reaction vessel is reduced while maintaining a hydrogen atmosphere (a cooling step).

When a heavy-metal impurity is mixed into an epitaxial layer (the silicon single crystal thin film) during the process for manufacturing a silicon epitaxial wafer as described above, characteristics of a device fabricated using this substrate may become abnormal in some cases.

When a surface layer side of the epitaxial layer that serves as a device active layer on which a device is formed is contaminated with an impurity, the device is considerably adversely affected.

As a conventional method for reducing heavy-metal impurity concentration in a silicon epitaxial wafer, for example, there has been disclosed a method for switching an atmospheric gas from a hydrogen atmosphere to a nitrogen atmosphere at 400° C. or below to precipitate Cu on a surface of the wafer at a cooling step of manufacture of a silicon epitaxial wafer and then removing a surface layer or a manufacturing method for switching an atmospheric gas from a hydrogen atmosphere to a nitrogen atmosphere at a temperature higher than 400° C. to precipitate Cu in a bulk portion rather than the surface so that the precipitation can be avoided in the surface layer portion (see Patent Document 1).

CITATION LIST

Patent Document

Patent Document 1: Japanese Patent No. 3664101

SUMMARY OF INVENTION

Since heavy-metal contamination of a silicon epitaxial wafer during a film forming process of a silicon single crystal thin film adversely affects a semiconductor device in many ways, reducing this contamination is important.

In conventional examples, as to Cu, there has been suggested a method for suppressing precipitation of Cu on a surface and thereby reducing contamination of a surface layer with Cu by adopting a process sequence, which increases a switching temperature when replacing a hydrogen gas with a nitrogen gas at the time of decreasing a temperature, in a cooling step in such a film formation process of a silicon single crystal thin film as described above.

However, in regard to impurities other than Cu, there is no effective impurity reducing countermeasure in the process sequence, and there is no effective method.

In view of the above-described problem, it is an object of the present invention to provide a method for manufacturing a silicon epitaxial wafer, the method enabling obtaining a silicon epitaxial wafer in which concentration of a heavy-metal impurity included in the silicon epitaxial wafer, especially an impurity in a surface layer region of a silicon single crystal thin film as a device active layer is lower than those in conventional examples and which has excellent device characteristics.

To solve the above-described problem, in the present invention, there is provided a method for manufacturing a silicon epitaxial wafer, comprising: a film forming step for vapor-phase growing a silicon single crystal thin film on a silicon single crystal substrate in a hydrogen atmosphere while supplying a source gas; and a cooling step for cooling a silicon epitaxial wafer having the silicon single crystal thin film formed at the film forming step by calculating a temperature at which a standard value or a process average value of concentration of an evaluation target impurity present in the silicon single crystal thin film coincides with solubility limit concentration of the evaluation target impurity and setting a cooling rate of the silicon epitaxial wafer after the film formation to be less than 20° C./sec in a temperature range of at least plus or minus 50° C. of the calculated temperature.

Almost all impurities in the silicon epitaxial wafer are present in a dissolved state in a high-temperature range immediately after an epitaxial reaction for silicon single crystal thin film formation. Further, precipitation begins when a temperature as a solubility limit is reached at the cooling step. Consequently, a temperature at which the standard value or the process average value (which can be calculated from manufacturing practice of silicon epitaxial wafers in the past) of concentration of the evaluation target impurity coincides with the solubility limit concentration of the evaluation target impurity is calculated. When cooling is effected while controlling the cooling rate to be less than 20° C./sec in the temperature range of at least plus or minus 50° C. from the calculated temperature, the evaluation target impurity is precipitated in a bulk of the wafer, whereby this impurity can be prevented from being precipitated in the surface layer region of the silicon single crystal thin film which is the device active layer. Therefore, the epitaxial wafer having the silicon single crystal thin film with reduced impurity concentration in the surface layer portion can be obtained, thereby manufacturing the silicon epitaxial wafer having good device characteristics.

Here, it is preferable to set the cooling rate to 5° C./sec or above.

When the cooling rate of the epitaxial wafer after film formation in at least the previously calculated temperature range is lowered, the evaluation target impurity concentration in the surface layer portion of the silicon single crystal thin film can be reduced, but cooling takes more time as the cooling rate is lowered, thus deteriorating productivity. However, when the cooling rate is not lower than 5° C./sec, the silicon epitaxial wafer having low impurity concentration in the device active layer can be manufactured without substantially deteriorating the productivity.

Moreover, it is preferable to adopt Ni as the evaluation target impurity.

Content of Ni in a silicon single crystal thin film in a general silicon epitaxial wafer is assumed to fall within the range of approximately $1 \times 10^9$ atoms/cm$^3$ to $1 \times 10^{11}$ atoms/cm$^3$.

Therefore, referring to FIG. 2, a temperature zone with which this concentration range becomes a solubility limit of Ni is 300° C. to 400° C. Accordingly, when the evaluation target impurity is Ni, the precipitation of Ni in the surface layer portion of the silicon single crystal thin film as the device active region can be reduced by controlling the cooling rate in the range of at least 400° C. to 300° C. to be less than 20° C./sec at the cooling step, whereby the epitaxial wafer having excellent device characteristics can be efficiently manufactured.

As described above, at the cooling step after the film formation reaction of the silicon single crystal thin film, the silicon epitaxial wafer is slowly cooled at less than 20° C./sec in the vicinity (approximately ±50° C.) of a temperature at which the standard value or the process average value of the evaluation target impurity coincides with the solubility limit concentration of a contamination element, i.e., a temperature zone in which the contamination element begins to be supersaturated.

As a result, the impurity (the contamination element) in the silicon epitaxial wafer can be prevented from aggregating in the surface layer portion of the silicon single crystal thin film, thereby facilitating the precipitation in a bulk. Consequently, it is possible to obtain the silicon epitaxial wafer having low impurity concentration in the silicon single crystal thin film surface layer portion, which is the device active region.

DESCRIPTION OF EMBODIMENT

The present invention will now be more specifically described hereinafter.

There has been conventionally little-known a manufacturing method for effectively reducing an amount of heavy-metal impurity included in a surface layer portion of a silicon single crystal thin film which serves as a device active region of a silicon epitaxial wafer.

Therefore, when using a silicon epitaxial wafer manufactured by a conventional manufacturing method to manufacture a semiconductor device, there is a problem that a product having poor device characteristics is manufactured in some cases even though a wafer having good impurity concentration evaluation is adopted.

Therefore, the present inventor has repeatedly conducted keen examination and experiments in order to solve such a problem.

As a result, attention has been paid to cooling conditions after growth of an epitaxial layer (the silicon single crystal thin film) as conditions that affect the impurity concentration in the surface layer of the silicon epitaxial wafer. In particular, attention has been focused on a cooling rate in a temperature zone in which a contained heavy-metal impurity becomes supersaturated, and changing this cooling rate has been conceived.

Additionally, as a result of repeatedly conducting further keen examination/experiments, the present inventor has perceived that an evaluation target impurity can be precipitated in a bulk of a silicon epitaxial wafer by calculating a temperature at which a standard value or a process average value of concentration of the evaluation target impurity present in a silicon single crystal thin film coincides with solubility limit concentration and setting a cooling rate of a silicon epitaxial wafer after film formation to be less than 20° C./sec in a temperature range of at least plus or minus 50° C. from the calculated temperature, whereby the silicon epitaxial wafer having low impurity concentration in a surface layer portion of the silicon single crystal thin film can be obtained, thereby attaining the present invention.

Figure 1:
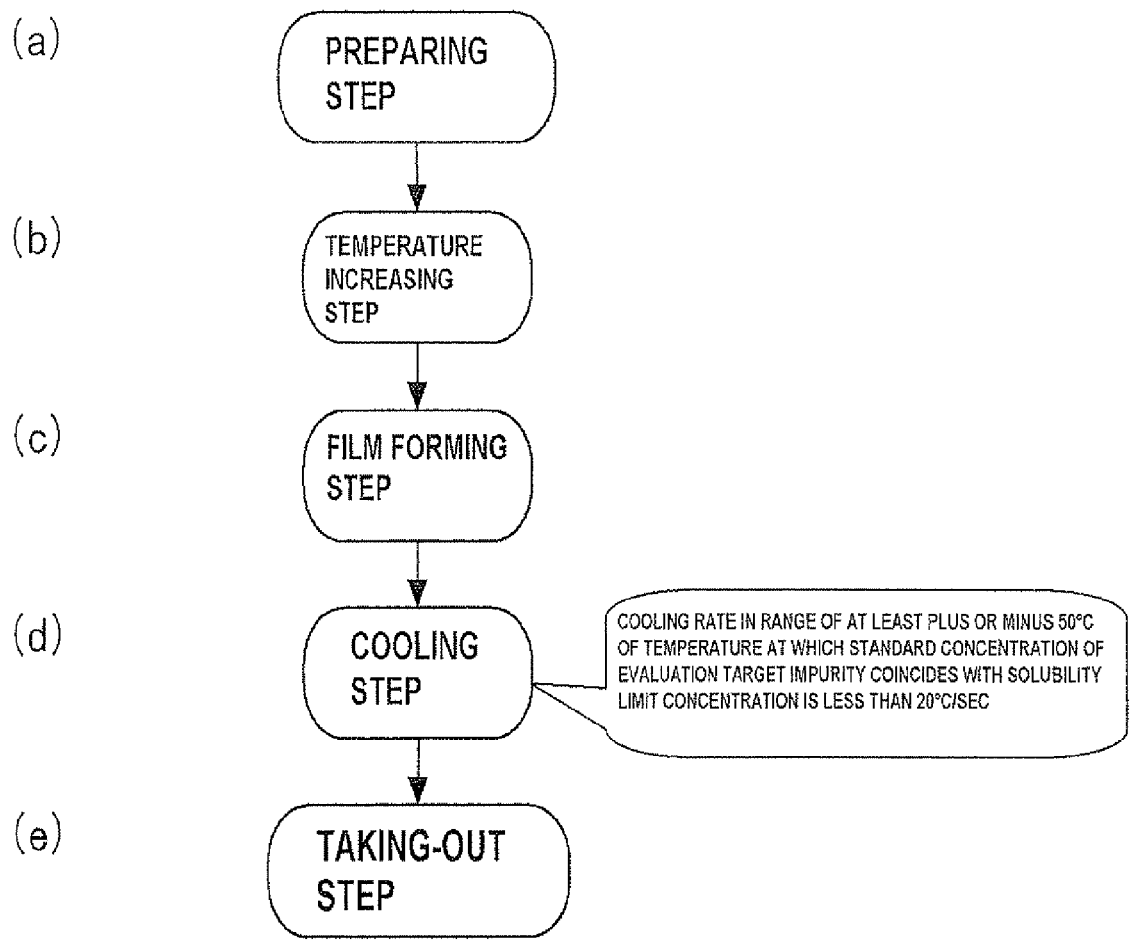
FIG. 1 is a flowchart showing an example of an outline of a method for manufacturing a silicon epitaxial wafer according to the present invention.

Although the present invention will now be described hereinafter in detail with reference to the drawings, the present invention is not restricted thereto. FIG. 1 is a flowchart showing an example of an outline of a method for manufacturing a silicon epitaxial wafer according to the present invention.

First, as shown in FIG. 1, a silicon single crystal substrate is placed on a susceptor provided in a reaction vessel of a vapor-phase growth apparatus using a conveying apparatus (FIG. 1(a), preparation).

Then, a temperature in the reaction vessel is increased to a film forming temperature to vapor-phase grow the silicon single crystal thin film while flowing a hydrogen gas into the reaction vessel (FIG. 1(b), temperature rising). This film forming temperature is set to 1000° C. or above at which a natural oxide film on a substrate surface can be removed using hydrogen.

Then, a source gas and a dopant gas are supplied at a respective predetermined flow rates together with the hydrogen gas while maintaining the inside of the reaction vessel at the film forming temperature, and a silicon single crystal thin film is grown on the silicon single crystal substrate in a hydrogen atmosphere until the silicon single crystal thin film has a predetermined film thickness (FIG. 1(c), a film forming step).

Thereafter, the supply of the source gas and the dopant gas is stopped, and the temperature in the reaction vessel is reduced to cool a silicon epitaxial wafer while flowing hydrogen as a carrier gas (FIG. 1(d), a cooling step).

At this cooling step, a temperature at which a standard value or a process average value of concentration of an evaluation target impurity present in the silicon single crystal thin film coincides with solubility limit concentration of the evaluation target impurity is calculated, and a cooling rate of the silicon epitaxial wafer after film formation is set to be less than 20° C./sec in the temperature range of at least plus or minus 50° C. from the calculated temperature to effect cooling.

Further, the hydrogen atmosphere can be switched to a nitrogen atmosphere in the range of 800° C. to approximately 400° C.

Almost all impurities in the silicon wafer are present in a dissolved state in a high-temperature region immediately after an epitaxial reaction for formation of the silicon single crystal thin film, and precipitation begins from a time point that a temperature as a solubility limit is reached at the cooling step.

Therefore, when the temperature at which the standard value or the process average value of concentration of the evaluation target impurity coincides with the solubility limit concentration of the evaluation target impurity is calculated and the cooling rate at the cooling step after the film forming step of the silicon single crystal thin film is controlled to be less than 20° C./sec in the temperature range of at least plus or minus 50° C. from this calculated temperature, the evaluation target impurity in the silicon epitaxial wafer can be precipitated in a bulk portion rather than a surface layer region of the silicon single crystal thin film which is a device active layer.

Therefore, it is possible to obtain the silicon epitaxial wafer that has lower impurity concentration in the surface layer portion of the silicon single crystal thin film than that in the conventional example and also has good device characteristics.

The cooling rate is less than 20° C./sec, and a lower cooling rate is desirable.

Here, Ni can be adopted as the evaluation target impurity.

Content of Ni in a silicon single crystal thin film of a general silicon epitaxial wafer is assumed to be at a level of $1\times10^9$ to $1\times10^{11}$ atoms/cm$^3$.

Figure 2:
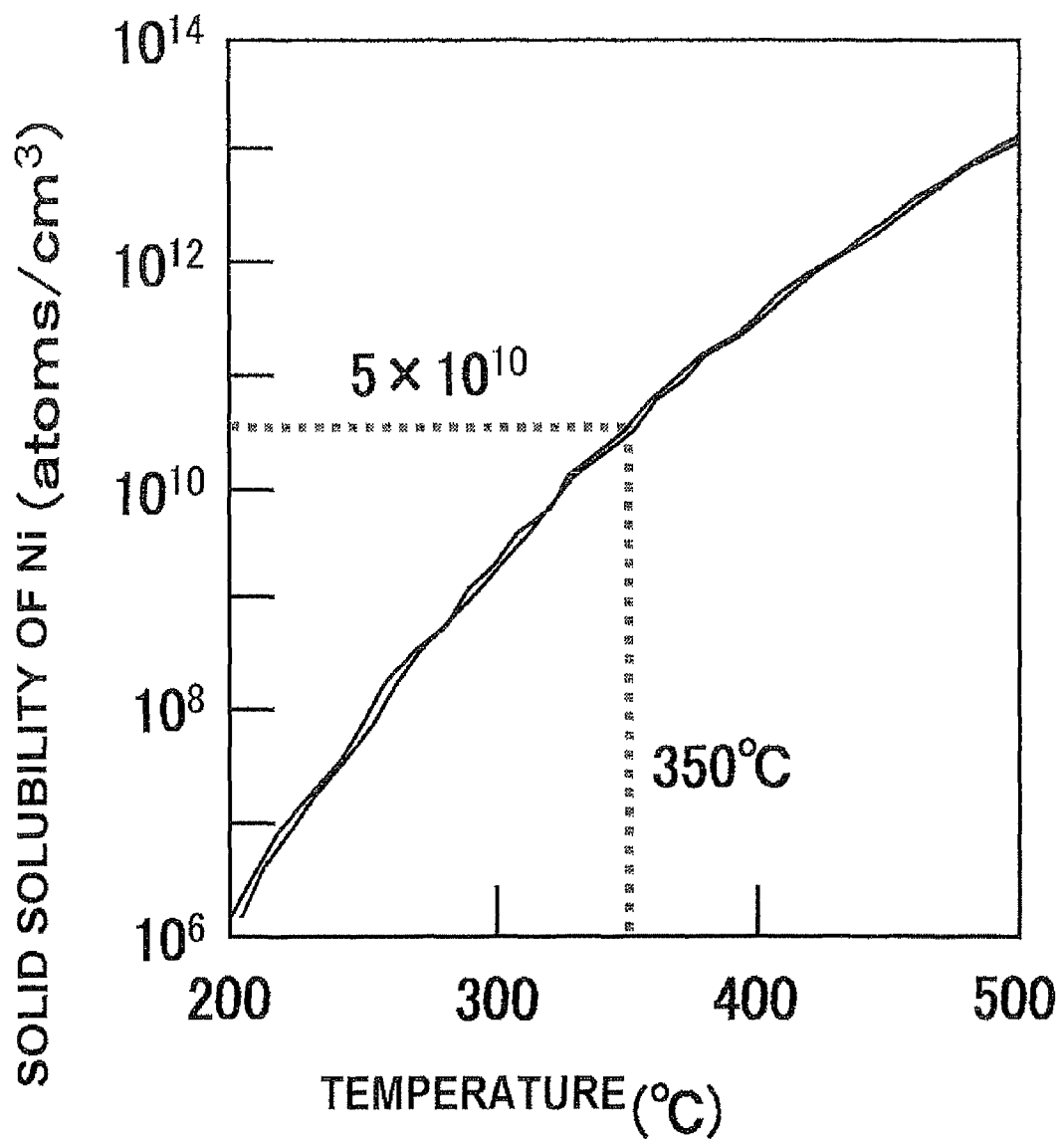
FIG. 2 is a view showing temperature dependence of solid solubility of Ni in silicon.

As shown in FIG. 2, assuming that a contamination level of Ni is approximately $5\times10^{10}$ atoms/cm$^3$ in the above-described range, a temperature at which the content coincides with solid solubility is approximately 350° C.

Therefore, in case that the evaluation target impurity is Ni, the cooling rate is controlled to be less than 20° C./sec when a temperature of the silicon epitaxial wafer which is being cooled gets through a temperature zone of at least 400° C. to 300° C.

It is to be noted that FIG. 2 is a view showing temperature dependence of the solid solubility of Ni in silicon.

Figure 3:
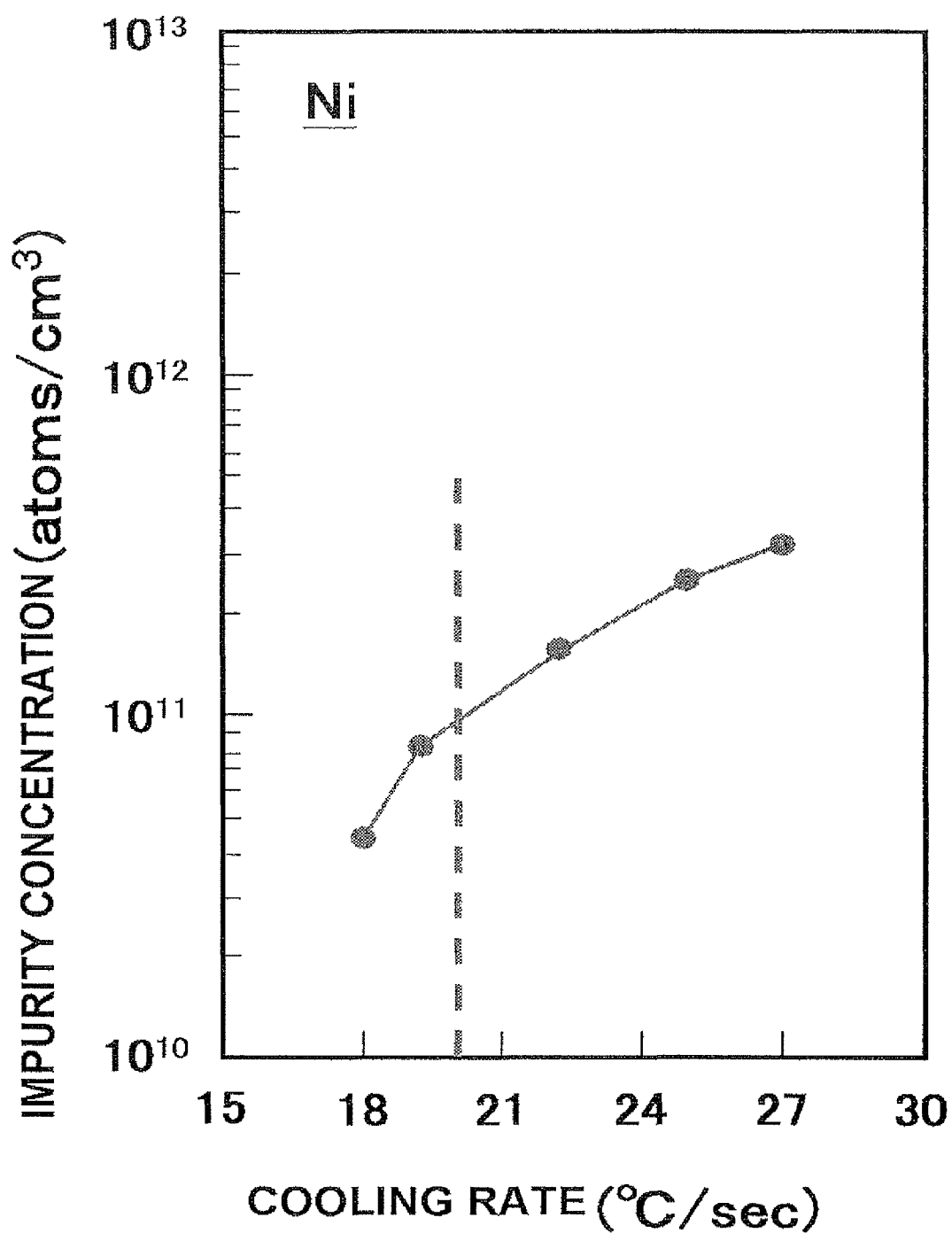
FIG. 3 is a view showing a relationship between a cooling rate in the vicinity of 350° C. at a cooling step after a film formation reaction of a silicon single crystal thin film and concentration of Ni aggregating in a silicon single crystal thin film surface layer portion.

Further, as shown in FIG. 3, it is considered that Ni is concentrated near the surface layer portion of the silicon single crystal thin film as the cooling rate is high and the Ni concentration near the surface layer is reduced and the precipitation can be effected in the bulk as the cooling rate is low (slow cooling). That is, when the slow cooling is carried out in the temperature zone in which the standard value or the process average value of the concentration of the evaluation target impurity present in the silicon single crystal thin film coincides with the solubility limit concentration, the silicon epitaxial wafer having a region with low Ni concentration in the surface layer portion of the silicon single crystal thin film can be obtained.

It is to be noted that FIG. 3 is a view showing a relationship between the cooling rate near 350° C. at the cooling step after a film forming reaction of the silicon single crystal thin film and the concentration of Ni concentrated in the silicon single crystal thin film surface layer portion.

When Ni that adversely affects device characteristics is selected as the evaluation target impurity and the cooling rate in a temperature region that the silicon Epitaxial wafer has a temperature of at least 400° C. to 300° C. is controlled to be less than 20° C./sec, Ni can be precipitated in the bulk portion rather than the surface layer portion of the silicon single crystal thin film, thereby obtaining the silicon epitaxial wafer having low Ni concentration in the surface layer portion. As a result, the high-quality silicon epitaxial wafer with suppressed Ni concentration that adversely affects device characteristics can be manufactured.

Furthermore, the cooling rate can be set to 5° C./sec or above.

As described above, although the evaluation target impurity concentration in the surface layer portion of the silicon single crystal thin film can be decreased by lowering the cooling rate of the silicon epitaxial wafer after the film formation in the range of at least plus or minus 50° C. from the temperature at which the standard value or the process average value of concentration of the evaluation target impurity present in the silicon single crystal thin film coincides with the solubility limit concentration, productivity is deteriorated when the cooling rate is extremely lowered (the slow cooling).

However, when the cooling rate is set to 5° C./sec or above, the silicon epitaxial wafer having the low impurity concentration in the device active layer can be manufactured without substantially deteriorating the productivity.

Moreover, when a taking-out temperature is reached while keeping the nitrogen atmosphere, the silicon epitaxial wafer is taken out from the vapor-phase growth apparatus (FIG. 1(e), taking-out).

Then, cleaning, packaging, a shipping step, and others are arbitrarily carried out, thereby manufacturing the high-quality silicon epitaxial wafer having excellent device characteristics that the evaluation target impurity concentration is not greater than the standard value or the process average value.

The thus manufactured silicon epitaxial wafer has small impurity content in the surface layer region of the silicon single crystal thin film and is superior in semiconductor device characteristics.

EXAMPLES

The present invention will now be more specifically described based on examples and comparative examples, but the present invention is not restricted thereto.

Examples 1-3, Comparative Example 1

Five P$^+$-type (0.015 Ωcm) silicon single crystal substrates having an orientation (100) which were confirmed to have Ni concentration of $1\times10^{10}$ atoms/cm$^3$ or below (a lower detection limit) were prepared in advance, and a P$^-$-type (10 Ωcm) silicon single crystal thin film of 5 μm was vapor-phase grown on a main surface of each of these substrates at a film forming temperature of 1130° C.

It is to be noted that, as a method for confirming the Ni concentration, a silicon single crystal substrate that is in the same batch as the five prepared silicon single crystal substrates was sampled and confirmed using a total dissolution chemical analysis method.

Further, since a calculated temperature at which the Ni concentration of each of the five prepared silicon single crystal substrates coincides with solubility limit concentration was approximately 350° C., a cooling rate in the range of 400° C. to 300° C. was changed to 0.5° C./sec (Example 1), 5° C./sec (Example 2), 18° C./sec (Example 3), 20° C./sec (Comparative Example 1), and 25° C./sec (Comparative Example 2) at the time of cooling each silicon epitaxial wafer after film formation, thereby manufacturing each silicon epitaxial wafer.

A surface layer of 1.5 μm of the silicon single crystal thin film was extracted from each of five silicon epitaxial wafers by a step etching method (see Japanese Unexamined Patent Application Publication No. 2005-265718, Japanese Patent No. 3755586, and others) and concentration of a heavy-metal including Ni was measured using an ICP-MS apparatus. Table 1 shows its result.

TABLE 1

|  | Example 1 | Example 2 | Example 3 | Comparative Example 1 | Comparative Example 2 |
|---|---|---|---|---|---|
| Average cooling rate during cooling from 400° C. to 300° C. (° C./sec) | 0.5 | 5 | 18 | 20 | 25 |
| Ni concentration in surface layer (atoms/cm$^3$) | Lower detection limit or below (1.0 × 10$^{10}$ or below) | Lower detection limit or below (1.0 × 10$^{10}$ or below) | Lower detection limit or below (1.0 × 10$^{10}$ or below) | 8.0 × 10$^{10}$ | 2.0 × 10$^{11}$ |

Consequently, as shown in Table 1, under cooling conditions of Comparative Examples 1 and 2, 8×10$^{10}$ atoms/cm$^3$ and 2×10$^{11}$ atoms/cm$^3$ were detected as the Ni concentration in the surface layer of each silicon single crystal thin film. That is, this means that Ni is present in the surface layer with this concentration.

On the other hand, under cooling conditions of Examples 2 and 3, the Ni concentration in the surface layer of each silicon single crystal thin film was equal to or below the lower detection limit (1.0×10$^{10}$ atoms/cm$^3$) of the ICP-MS apparatus, and it was revealed that the concentration is lower than those comparative examples 1 and 2, namely, an amount of an Ni impurity in the surface layer portion of each silicon single crystal thin film is smaller than that of each wafer cooled under the conditions of Comparative Examples 1 and 2.

Further, in regard to the silicon epitaxial wafer cooled under the cooling conditions of Example 1, the Ni concentration was concentration equal to or below a lower detection limit (1.0×10$^{10}$ atoms/cm$^3$) of the ICP-MS apparatus, but the cooling rate is low in this Example 1, and hence a process time is prolonged. Therefore, it was also found out that, considering a problem of productivity, setting the cooling rate to 5° C./sec or above is good.

It is to be noted that the present invention is not restricted to the foregoing embodiment. The foregoing embodiment is just an illustrative example, and any examples that have substantially the same configuration and exercise the same functions and effects as the technical concept described in claims of the present invention are included in the technical scope of the present invention.

For example, the vapor-phase growth apparatus that enables a thin film to be subjected to vapor-phase growth is not restricted in the present invention, and the present invention can be applied to various vapor-phase growth apparatuses which are of, e.g., a vertical type (a pancake type), a barrel type (a cylinder type), a sheet type, and others.

The invention claimed is:

1. A method for manufacturing a silicon epitaxial wafer, comprising:
    a film forming step for vapor-phase growing a silicon single crystal thin film on a silicon single crystal substrate in a hydrogen atmosphere while supplying a source gas; and
    a cooling step for cooling a silicon epitaxial wafer having the silicon single crystal thin film formed at the film forming step by calculating a temperature at which a standard value or a process average value of concentration of an evaluation target impurity present in the silicon single crystal thin film coincides with solubility limit concentration of the evaluation target impurity and setting a cooling rate of the silicon epitaxial wafer after the film formation to be less than 20° C./sec in a temperature range of at least plus or minus 50° C. from the calculated temperature,
    wherein said cooling step is performed immediately after said film forming step.

2. The method for manufacturing a silicon epitaxial wafer according to claim 1,
    wherein the cooling rate is set to 5° C./sec or above.

3. The method for manufacturing a silicon epitaxial wafer according to claim 1,
    wherein the evaluation target impurity is Ni.

4. The method for manufacturing a silicon epitaxial wafer according to claim 2,
    wherein the evaluation target impurity is Ni.

* * * * *